(12) United States Patent
Broughton et al.

(10) Patent No.: US 7,061,289 B1
(45) Date of Patent: Jun. 13, 2006

(54) METHOD AND SYSTEM FOR INTERNALLY RESETTING A CHARGE PUMP

(75) Inventors: David L. Broughton, Tacoma, WA (US); Kim Y. Wong, Renton, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 813 days.

(21) Appl. No.: 10/236,034

(22) Filed: Sep. 4, 2002

(51) Int. Cl.
*H03L 7/06* (2006.01)

(52) U.S. Cl. ............................. 327/157; 327/148

(58) Field of Classification Search ............... None
See application file for complete search history.

(56) References Cited

U.S. PATENT DOCUMENTS

| | | | |
|---|---|---|---|
| 5,736,880 A * | 4/1998 | Bruccoleri et al. | 327/157 |
| 6,642,759 B1 * | 11/2003 | Hughes | 327/157 |
| 6,664,829 B1 * | 12/2003 | Hughes | 327/157 |
| 6,792,062 B1 * | 9/2004 | Vaucher | 375/374 |

* cited by examiner

*Primary Examiner*—Kenneth B. Wells
*Assistant Examiner*—An T. Luu

(57) ABSTRACT

A method for internally resetting a charge pump is provided that includes receiving an up signal and a down signal simultaneously. A feedback signal is generated based on the up and down signals. The feedback signal is provided internally to the charge pump. The charge pump is reset based on the feedback signal.

20 Claims, 4 Drawing Sheets

METHOD AND SYSTEM FOR INTERNALLY RESETTING A CHARGE PUMP

TECHNICAL FIELD OF THE INVENTION

The present invention relates generally to phase-locked loops and, more particularly, to a method and system for internally resetting a charge pump.

BACKGROUND OF THE INVENTION

In many electronic systems, the clock signals that drive an integrated circuit are generated by a phase-locked loop (PLL) frequency synthesizer. The performance of the PLL frequency synthesizer is dependent on several parameters, including a minimum charge pump pulse width and corresponding phase noise. The minimum charge pump pulse width is limited by a feedback signal propagation time, which is the amount of time for a feedback signal from the charge pump to reset the phase detector and to propagate back through to the charge pump. The corresponding phase noise may not be reduced beyond the limits of the minimum charge pump pulse width.

In addition, some currently available PLL frequency synthesizers include one or more delay circuits to provide time-delayed phase signals in order to increase slew rates with respect to the charge pump output. In these PLL frequency synthesizers, therefore, the feedback signal propagation time is increased, resulting in an increased minimum charge pump pulse width and corresponding phase noise.

SUMMARY OF THE INVENTION

In accordance with the present invention, a method and system for internally resetting a charge pump are provided that substantially eliminate or reduce disadvantages and problems associated with conventional systems and methods. In particular, a feedback signal is provided internally to the charge pump to reduce the minimum charge pump pulse width and corresponding phase noise.

According to one embodiment of the present invention, a method for internally resetting a charge pump is provided that includes detecting the end of a charge pump event, signaled by an up signal and a down signal being received simultaneously. A feedback signal is generated based on the up and down signals. The feedback signal is provided internally to the charge pump. The charge pump is reset based on the feedback signal.

According to another embodiment of the present invention, a system for internally resetting a charge pump is provided that includes a phase detector and a charge pump. The phase detector is operable to receive a reference clock signal and an internal clock signal, to compare the reference clock signal and the internal clock signal, and to generate an up signal when the internal clock signal is slower than the reference clock signal and a down signal when the internal clock signal is faster than the reference clock signal. The charge pump is coupled to the phase detector. The charge pump is operable to receive the up and down signals, to generate a feedback signal based on the up and down signals, to provide the feedback signal internally to the charge pump, and to reset the charge pump based on the feedback signal.

According to yet another embodiment of the present invention, a charge pump is provided that includes a first bias timing circuit, a second bias timing circuit, a pump up circuit, a pump down circuit, a pump enable circuit, and a feedback circuit. The first bias timing circuit is operable to receive an up signal from a phase detector and an up-disable-in signal from the feedback circuit and to generate an up-bias-out signal based on the up signal and the up-disable-in signal. The second bias timing circuit is operable to receive a down signal from the phase detector and a down-disable-in signal from the feedback circuit and to generate a down-bias-out signal based on the down signal and the down-disable-in signal. The pump up circuit is coupled to the first bias timing circuit. The pump up circuit is operable to provide a current source based on the up signal. The pump down circuit is coupled to the second bias timing circuit. The pump down circuit is operable to provide a current sink based on the down signal. The pump enable circuit is coupled to the first and second bias timing circuits and to the pump up circuit and the pump down circuit. The pump enable circuit is operable to enable operation of the pump up circuit and the pump down circuit. The feedback circuit is coupled to the pump up and pump down circuits and to the first and second bias timing circuits. The feedback circuit is operable to generate a feedback signal based on the up and down signals, to provide the feedback signal internally to the charge pump, and to reset the charge pump based on the feedback signal. The phase detector is also operable to be reset based on the feedback signal.

Technical advantages of one or more embodiments of the present invention include providing an improved method for resetting a charge pump. In a particular embodiment, a feedback signal is provided internally to the charge pump such that the charge pump is reset before a reset signal that is used to reset an associated phase detector can be propagated through to the charge pump. As a result, the minimum charge pump pulse width is reduced, which causes a corresponding decrease in phase noise.

Other technical advantages will be readily apparent to one skilled in the art from the following figures, description, and claims.

Before undertaking the DETAILED DESCRIPTION OF THE INVENTION, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged phase-locked loop frequency synthesizer.

Figure 1:
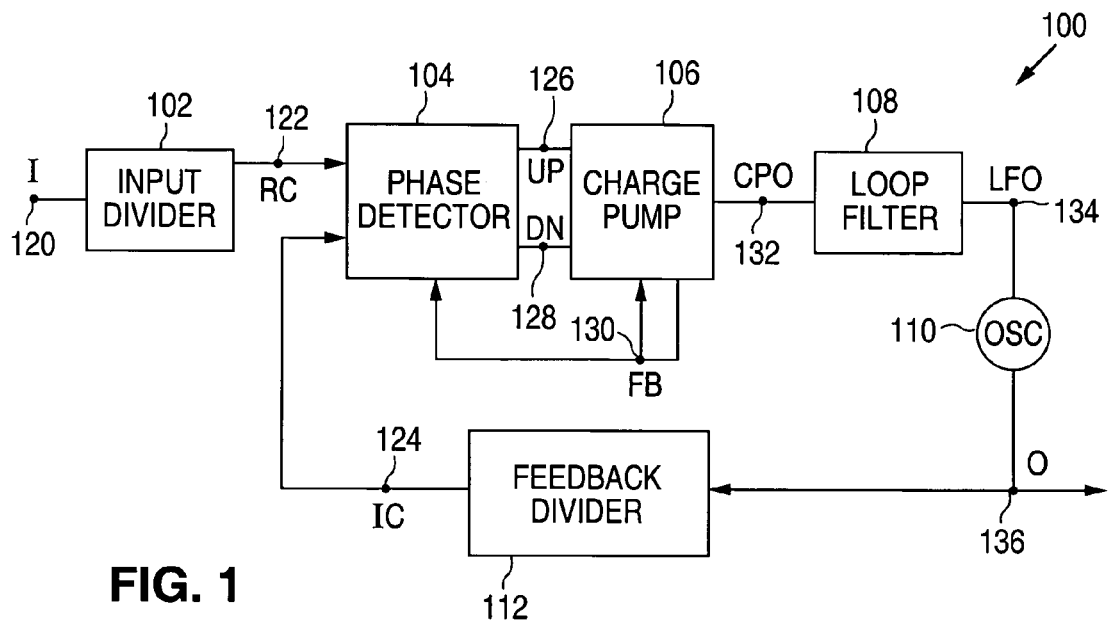
FIG. 1 is a block diagram illustrating a phase-locked loop frequency synthesizer operable to internally reset a charge pump in accordance with one embodiment of the present invention.

FIG. 1 is a block diagram illustrating a phase-locked loop (PLL) frequency synthesizer 100 in accordance with one embodiment of the present invention. The PLL frequency synthesizer 100 is operable to provide an internal clock signal for an integrated circuit or other suitable device that is synchronous to an external clock signal.

The PLL frequency synthesizer 100 comprises an input divider 102, a phase detector 104, a charge pump 106, a loop filter 108, an oscillator 110, and a feedback divider 112. The input divider 102 is operable to receive an input frequency (I) signal 120 from a component such as crystal oscillator or other suitable frequency source (not shown in FIG. 1) and to divide the input frequency 120 signal by a predetermined value to generate a reference clock signal 122.

The phase detector 104 is coupled to the input divider 102 and to the feedback divider 112. The phase detector 104 is operable to receive the reference clock signal 122 from the input divider 102 and an internal clock signal 124 from the feedback divider 112. The phase detector 104 is also operable to compare the phase and frequency of the reference clock signal 122 and the internal clock signal 124 and to generate an up signal 126 and/or a down (DN) signal 128 based on whether the internal clock signal 124 is faster or slower than the reference clock signal 122. If the internal clock signal 124 is too slow, the phase detector 104 is operable to generate the up signal 126, while if the internal clock signal 124 is too fast, the phase detector 104 is operable to generate the down signal 128.

The charge pump 106 is coupled to the phase detector 104 and is operable to be reset internally, as described in more detail below in connection with FIG. 2. As used herein, resetting the charge pump 106 "internally" means that the signal that is generated to reset the charge pump 106 is generated within the charge pump 106 and provided to the charge pump 106 directly without having to be propagated through any other component.

The charge pump 106 is operable to receive the up signal 126 and the down signal 128 from the phase detector 104. The charge pump 106 is also operable to generate a feedback (FB) signal 130 and a charge pump output (CPO) signal 132 based on the up and down signals 126 and 128.

In addition, the charge pump 106 is operable to provide the feedback signal 130 internally to itself and to the phase detector 104 in order to reset both the charge pump 106 and the phase detector 104. In the illustrated embodiment, the feedback signal 130 provided to the charge pump 106 is shown exiting and re-entering the charge pump 106. However, it will be understood that this is for illustration purposes, and the feedback signal 130 may be provided to the charge pump 106 without exiting the charge pump 106, as described in more detail below in connection with FIG. 2.

The charge pump 106 is operable to act as a current source when the up signal 126 is received from the phase detector 104 and as a current sink when the down signal 128 is received from the phase detector 104. Thus, the charge pump 106 may be operable to generate the charge pump output signal 132 by injecting current based on the up signal 126 and by draining current based on the down signal 128.

The loop filter 108 is coupled to the charge pump 106 and is operable to receive the charge pump output signal 132. The loop filter 108 is also operable to generate a loop filter output (LFO) signal 134 based on the charge pump output signal 132. According to one embodiment, the loop filter 108 comprises a capacitor and resistor network that is operable to be charged up by the charge pump output signal 132 when the phase detector 104 generates the up signal 126 for the charge pump 106 and is operable to have charge drained by the charge pump output signal 132 when the phase detector 104 generates the down signal 128 for the charge pump 106.

The oscillator 110 is coupled to the loop filter 108. The oscillator 110 may comprise a voltage-controlled oscillator or other suitable oscillator. The oscillator 110 is operable to receive the loop filter output signal 134 and to generate an output frequency (O) signal 136 based on the loop filter output signal 134.

The feedback divider 112 is coupled to the oscillator and to the phase detector 104. The feedback divider 112 is operable to receive the output frequency signal 136 and to generate the internal clock signal 124 based on the output frequency signal 136 by dividing the output frequency signal 136 by a predetermined value.

According to the embodiment in which the loop filter 108 comprises a capacitor and resistor network, the voltage on the capacitor comprises the input control voltage for the oscillator 110. As the voltage on the capacitor increases, the frequency of the output frequency signal 136 also increases, thereby speeding up the internal clock signal 124 generated by the feedback divider 112. As the voltage on the capacitor decreases, the frequency of the output frequency signal 136 also decreases, thereby slowing down the internal clock signal 124 generated by the feedback divider 112.

Figure 2:
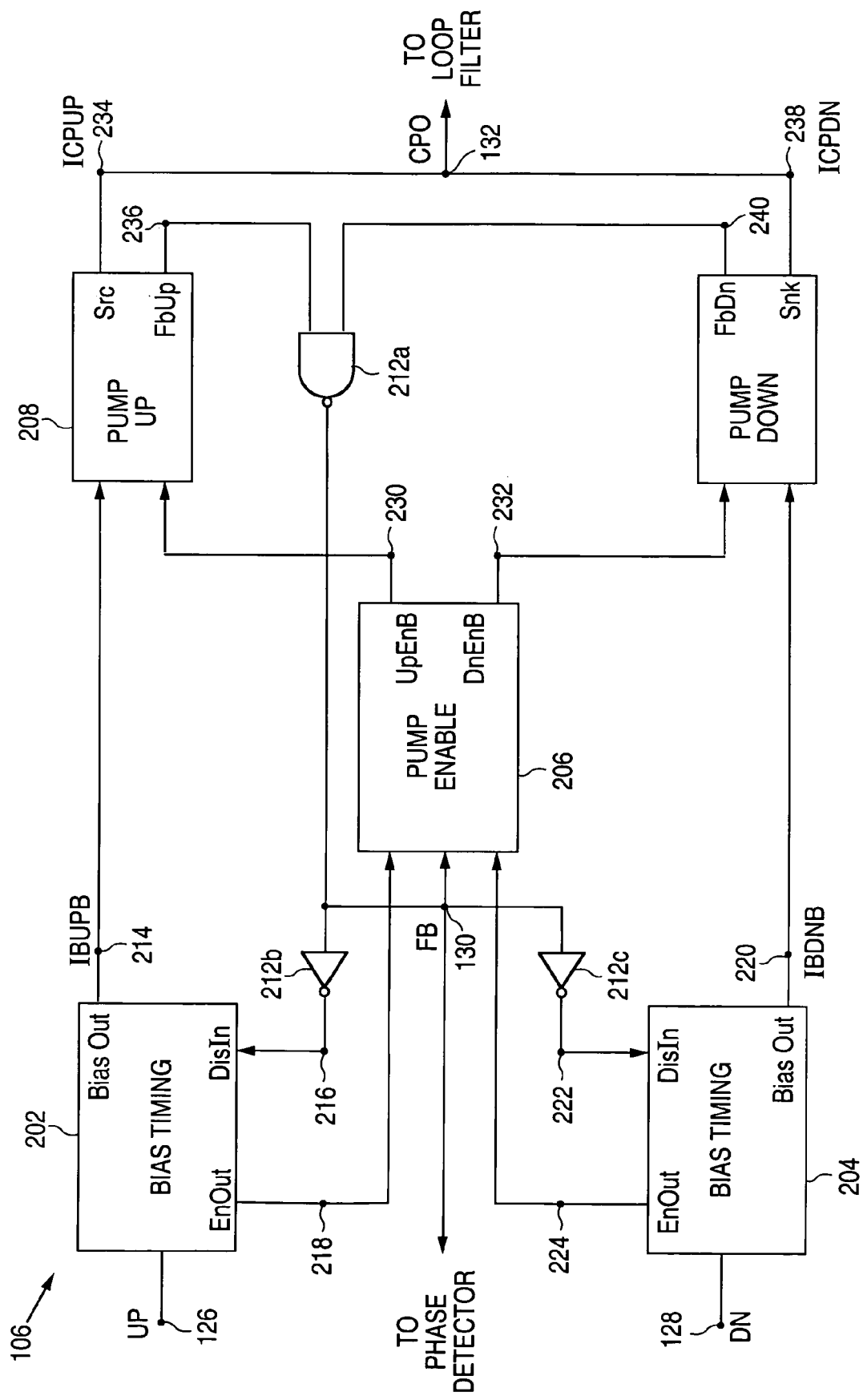
FIG. 2 is a block diagram illustrating the charge pump of FIG. 1 in accordance with one embodiment of the present invention.

FIG. 2 is a block diagram illustrating the charge pump 106 in accordance with one embodiment of the present invention. The charge pump 106 comprises a first bias timing circuit 202, a second bias timing circuit 204, a pump enable circuit 206, a pump up circuit 208, a pump down circuit 210, and a feedback circuit 212.

The first bias timing circuit 202 is operable to receive the up signal 126 from the phase detector 104 and a disable in (DisIn) signal 216 from the feedback circuit 212 and to generate a bias out (BiasOut) signal 214 based on the up signal 126 and the DisIn signal 216. According to one embodiment, the BiasOut signal 214 comprises a voltage (IBUPB) used to turn on a bias current in the charge pump 106. The first bias timing circuit 202 is also operable to generate an enable out (EnOut) signal 218 based on the up signal 126.

The second bias timing circuit 204 is operable to receive the down signal 128 from the phase detector 104 and a disable in (DisIn) signal 222 from the feedback circuit 212 and to generate a bias out (BiasOut) signal 220 based on the down signal 128 and the DisIn signal 222. According to one embodiment, the BiasOut signal 220 comprises a voltage (IBDNB) used to turn on a bias current in the charge pump 106. The second bias timing circuit 204 is also operable to generate an enable out (EnOut) signal 224 based on the down signal 128.

The pump enable circuit 206 is coupled to the first and second bias timing circuits 202 and 204. The pump enable circuit 206 is operable to receive the EnOut signal 218 from the first bias timing circuit 202, the EnOut signal 224 from the second bias timing circuit 204, and the feedback signal 130 from the feedback circuit 212. The pump enable circuit 206 is also operable to generate an up enable (UpEnB) signal 230 based on the EnOut signal 218 and the feedback signal 130 and to generate a down enable (DnEnB) signal 232 based on the EnOut signal 224 and the feedback signal 130.

For example, if the feedback signal 130 is not asserted, the pump enable circuit 206 is operable to generate the UpEnB signal 230 based on the EnOut signal 218 being asserted and to generate the DnEnB signal 232 based on the EnOut signal 224 being asserted. However, if the feedback signal 130 is asserted, the pump enable circuit 206 is operable to terminate the UpEnB and DnEnB signals 230 and 232.

The pump up circuit 208 is coupled to the first bias timing circuit 202 and to the pump enable circuit 206. The pump up circuit 208 is operable to provide a current source for the charge pump 106 based on the up signal 126 being asserted, as described below.

The pump up circuit 208 is operable to receive the BiasOut signal 214 from the first bias timing circuit 202 and the UpEnB signal 230 from the pump enable circuit 206. The pump up circuit 208 is also operable to generate a source (Src) signal 234 and a feedback up (FbUp) signal 236 based on the BiasOut and UpEnB signals 214 and 230. Thus, for example, when both the BiasOut and UpEnB signals 214 and 230 are asserted, the pump up circuit 208 is operable to generate the Src and FbUp signals 234 and 236. According to one embodiment, the Src signal 234 comprises a charge pump current (ICPUP) to inject current into the charge pump output signal 132.

The pump down circuit 210 is coupled to the second bias timing circuit 204 and to the pump enable circuit 206. The pump down circuit 210 is operable to provide a current sink for the charge pump 106 based on the down signal 128 being asserted, as described below.

The pump down circuit 210 is operable to receive the BiasOut signal 220 from the second bias timing circuit 204 and the DnEnB signal 232 from the pump enable circuit 206. The pump down circuit 210 is also operable to generate a sink (Snk) signal 238 and a feedback down (FbDn) signal 240 based on the BiasOut and DnEnB signals 220 and 232. Thus, for example, when both the BiasOut and DnEnB signals 220 and 232 are asserted, the pump down circuit 210 is operable to generate the Snk and FbDn signals 238 and 240. According to one embodiment, the Snk signal 238 comprises a charge pump current (ICPDN) to drain current from the charge pump output signal 132.

The feedback circuit 212 is coupled to the first and second bias timing circuits 202 and 204, to the pump enable circuit 206, to the pump up circuit 208, and to the pump down circuit 210. The feedback circuit 212 is operable to reset the charge pump 106 and the phase detector 104 when both the up and down signals 126 and 128 are asserted. According to one embodiment, the feedback circuit 212 comprises a two-input NAND gate 212a, a first inverter 212b and a second inverter 212c. However, it will be understood that the feedback circuit 212 may be otherwise suitably implemented without departing from the scope of the present invention.

The feedback circuit 212 is operable to receive the FbUp signal 236 from the pump up circuit 208 and the FbDn signal 240 from the pump down circuit 210. For the illustrated embodiment, the FbUp and FbDn signals 236 and 240 comprise logic high signals when the Src and Snk signals 234 and 238, respectively, are generated. In this case, the NAND gate output, which corresponds to the feedback signal 130, comprises a logic high unless both Src and Snk signals 234 and 238 are being generated. However, when both Src and Snk signals 234 and 238 are being generated, the feedback signal 130 comprises a logic low based on the FbUp and FbDn signals 236 and 240, which results in the charge pump 106 and the phase detector 104 being reset.

The feedback signal 130 is provided to the phase detector 104 and to the pump enable circuit 206. In addition, the feedback signal 130 is inverted by the first inverter 212b and provided as the DisIn signal 216 to the first bias timing circuit 202 and inverted by the second inverter 212c and provided as the DisIn signal 222 to the second bias timing circuit 204.

Figure 3:
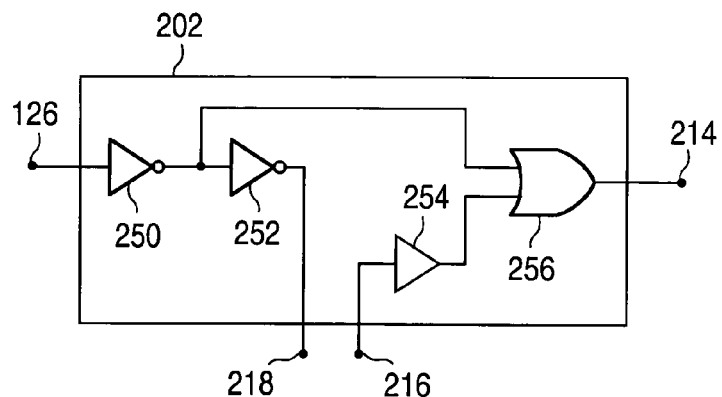
FIG. 3 is a circuit diagram illustrating the first bias timing circuit of FIG. 2 in accordance with one embodiment of the present invention.

FIG. 3 is a circuit diagram illustrating the first bias timing circuit 202 in accordance with one embodiment of the present invention. According to this embodiment, the first bias timing circuit 202 comprises a first inverter 250, a second inverter 252, a delay buffer 254, and an OR gate 256.

The first inverter 250 is operable to receive the up signal 126 from the phase detector 104, to invert the up signal 126 and to provide the inverted up signal 126 to the second inverter 252 and to the OR gate 256. The second inverter 252 is operable to receive the inverted up signal 126 from the first inverter 250, to invert the inverted up signal 126 and to provide this signal, which corresponds to the up signal 126, to the pump enable circuit 206 as the EnOut signal 218.

The delay buffer 254 is operable to receive the DisIn signal 216 from the feedback circuit 212, to delay the DisIn signal 216 for a predetermined amount of time and to provide the delayed DisIn signal 216 to the OR gate 256.

The OR gate 256 is operable to receive the inverted up signal 126 from the first inverter 250 and the delayed DisIn signal 216 from the delay buffer 254 and to generate the BiasOut signal 214 based on those signals. For example, when the FbUp and FbDn signals 236 and 240 are not asserted, the feedback signal 130 is high, resulting in the DisIn signal 216 being low. Thus, in this situation, when the up signal 126 goes high, the OR gate 256 will generate a low BiasOut signal 214. Otherwise, the OR gate 256 will generate a high BiasOut signal 214.

Therefore, when a high up signal 126 is received and the feedback signal 130 does not indicate that the charge pump 106 is to be reset, the first bias timing circuit 202 provides a low BiasOut signal 214 in order to turn on the pump up circuit 208. However, as described in more detail below in connection with FIG. 5, the pump up circuit 208 does not generate its outputs 234 and 236 until enabled by the pump enable circuit 206.

Figure 4:
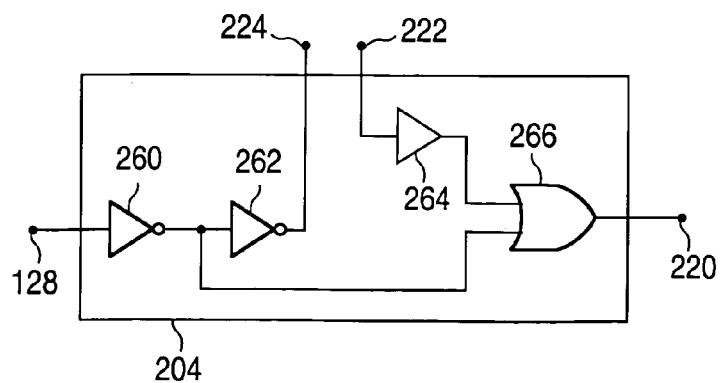
FIG. 4 is a circuit diagram illustrating the second bias timing circuit of FIG. 2 in accordance with one embodiment of the present invention.

FIG. 4 is a circuit diagram illustrating the second bias timing circuit 204 in accordance with one embodiment of the present invention. According to this embodiment, the second bias timing circuit 204 comprises a first inverter 260, a second inverter 262, a delay buffer 264, and an OR gate 266.

The first inverter 260 is operable to receive the down signal 128 from the phase detector 104, to invert the down signal 128 and to provide the inverted down signal 128 to the second inverter 262 and to the OR gate 266. The second inverter 262 is operable to receive the inverted down signal 128 from the first inverter 260, to invert the inverted down signal 128 and to provide this signal, which corresponds to the down signal 128, to the pump enable circuit 206 as the EnOut signal 224.

The delay buffer 264 is operable to receive the DisIn signal 222 from the feedback circuit 212, to delay the DisIn signal 222 for a predetermined amount of time and to provide the delayed DisIn signal 222 to the OR gate 266.

The OR gate 266 is operable to receive the inverted down signal 128 from the first inverter 260 and the delayed DisIn signal 222 from the delay buffer 264 and to generate the BiasOut signal 220 based on those signals. For example, when the FbUp and FbDn signals 236 and 240 are not asserted, the feedback signal 130 is high, resulting in the DisIn signal 222 being low. Thus, in this situation, when the down signal 128 goes high, the OR gate 266 will generate a low BiasOut signal 220. Otherwise, the OR gate 266 will generate a high BiasOut signal 220.

Therefore, when a high down signal 128 is received and the feedback signal 130 does not indicate that the charge pump 106 is to be reset, the second bias timing circuit 204 provides a low BiasOut signal 220 in order to turn on the pump down circuit 210. However, as described in more detail below in connection with FIG. 5, the pump down circuit 210 does not generate its outputs 238 and 240 until enabled by the pump enable circuit 206.

Figure 5:
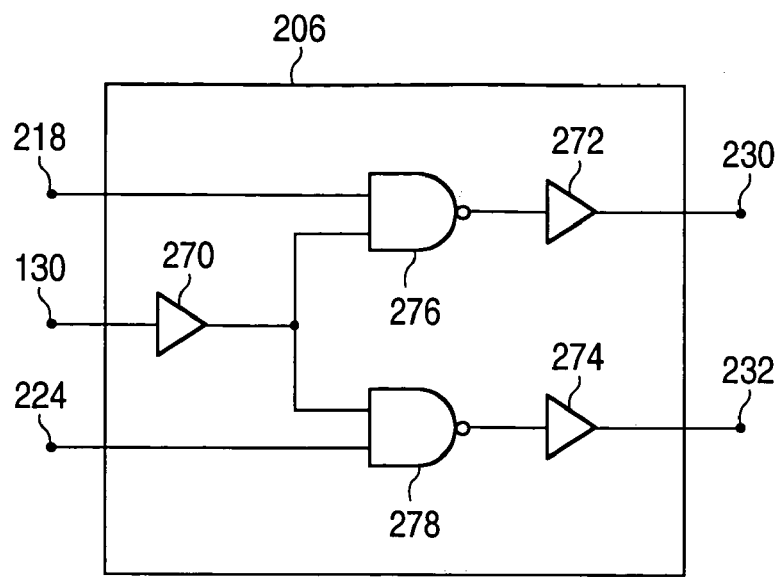
FIG. 5 is a circuit diagram illustrating the pump enable circuit of FIG. 2 in accordance with one embodiment of the present invention.

FIG. 5 is a circuit diagram illustrating the pump enable circuit 206 in accordance with one embodiment of the present invention. According to this embodiment, the pump enable circuit 206 comprises a first delay buffer 270, a second delay buffer 272, a third delay buffer 274, a first NAND gate 276, and a second NAND gate 278.

The first delay buffer 270 is operable to receive the feedback signal 130 from the feedback circuit 212, to delay the feedback signal 130 for a predetermined amount of time and to provide the delayed feedback signal 130 to the first and second NAND gates 276 and 278. According to one embodiment, the predetermined amount of time for the first delay buffer 270 corresponds to the predetermined amount of times for the delay buffers 254 and 264 of FIGS. 3 and 4.

The first NAND gate 276 is operable to receive the EnOut signal 218 from the first bias timing circuit 202 and the delayed feedback signal 130 from the first delay buffer 270 and to generate an initial UpEnB signal based on those signals. Thus, when both the EnOut signal 218 and the delayed feedback signal 130 are high, the first NAND gate 276 will generate a low initial UpEnB signal. Otherwise, the NAND gate 276 will generate a high initial UpEnB signal.

The second delay buffer 272 is operable to receive the initial UpEnB signal from the first NAND gate 276, to delay the initial UpEnB signal for a predetermined amount of time and to provide the delayed initial UpEnB signal as the UpEnB signal 230 to the pump up circuit 208. The predetermined amount of time may be based on desired the drive strength, the desired minimum charge pump pulse width, and the structure of the pump up circuit 208 in order to ensure that the pump up circuit 208 is fully turned on by the BiasOut signal 214 before being enabled by the UpEnB signal 230.

The second NAND gate 278 is operable to receive the EnOut signal 224 from the second bias timing circuit 204 and the delayed feedback signal 130 from the first delay buffer 270 and to generate an initial DnEnB signal based on those signals. Thus, when both the EnOut signal 224 and the delayed feedback signal 130 are high, the second NAND gate 278 will generate a low initial DnEnB signal. Otherwise, the NAND gate 278 will generate a high initial DnEnB signal.

The third delay buffer 274 is operable to receive the initial DnEnB signal from the second NAND gate 278, to delay the initial DnEnB signal for a predetermined amount of time and to provide the delayed initial DnEnB signal as the DnEnB signal 232 to the pump down circuit 210. The predetermined amount of time may be based on desired the drive strength, the desired minimum charge pump pulse width, and the structure of the pump down circuit 210 in order to ensure that the pump down circuit 210 is fully turned on by the BiasOut signal 220 before being enabled by the DnEnB signal 232.

Figure 6:
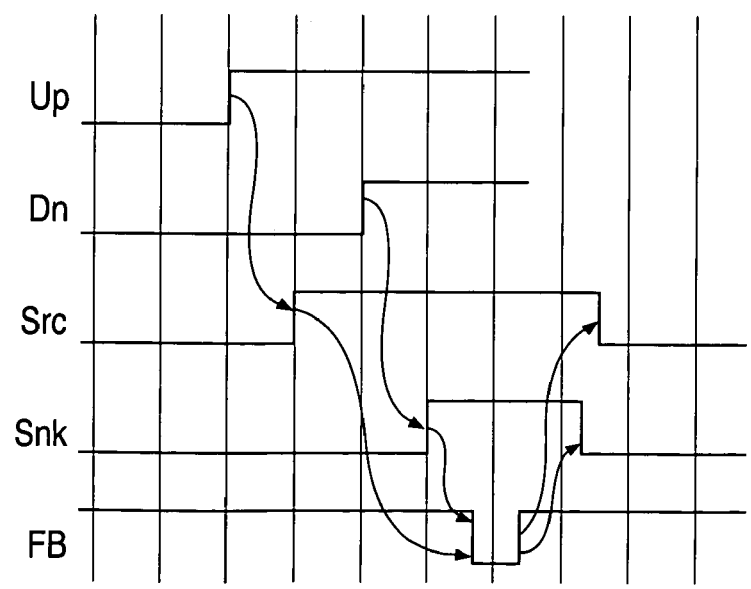
FIG. 6 is a timing diagram illustrating the timing of selected signals in the charge pump of FIG. 2 in accordance with one embodiment of the present invention.

FIG. 6 is a timing diagram 300 illustrating the timing of selected signals in the charge pump 106 in accordance with one embodiment of the present invention. When the up signal 126 is asserted, the BiasOut signal 214 is asserted. After the BiasOut signal 214 is asserted, the UpEnB signal 230 is asserted, resulting in the Src signal 234 being generated for the charge pump output signal 132. In addition, when the down signal 128 is asserted, the BiasOut signal 220 is asserted. After the BiasOut signal 220 is asserted, the DnEnB signal 232 is asserted, resulting in the Snk signal 238 being generated for the charge pump output signal 132.

The feedback signal 130 is generated when both the Src signal 234 and the Snk signal 238 are generated, which resets the phase detector 104 and resets the charge pump 106 by resetting the first and second bias timing circuits 202 and 204 and the pump enable circuit 206.

Figure 7:
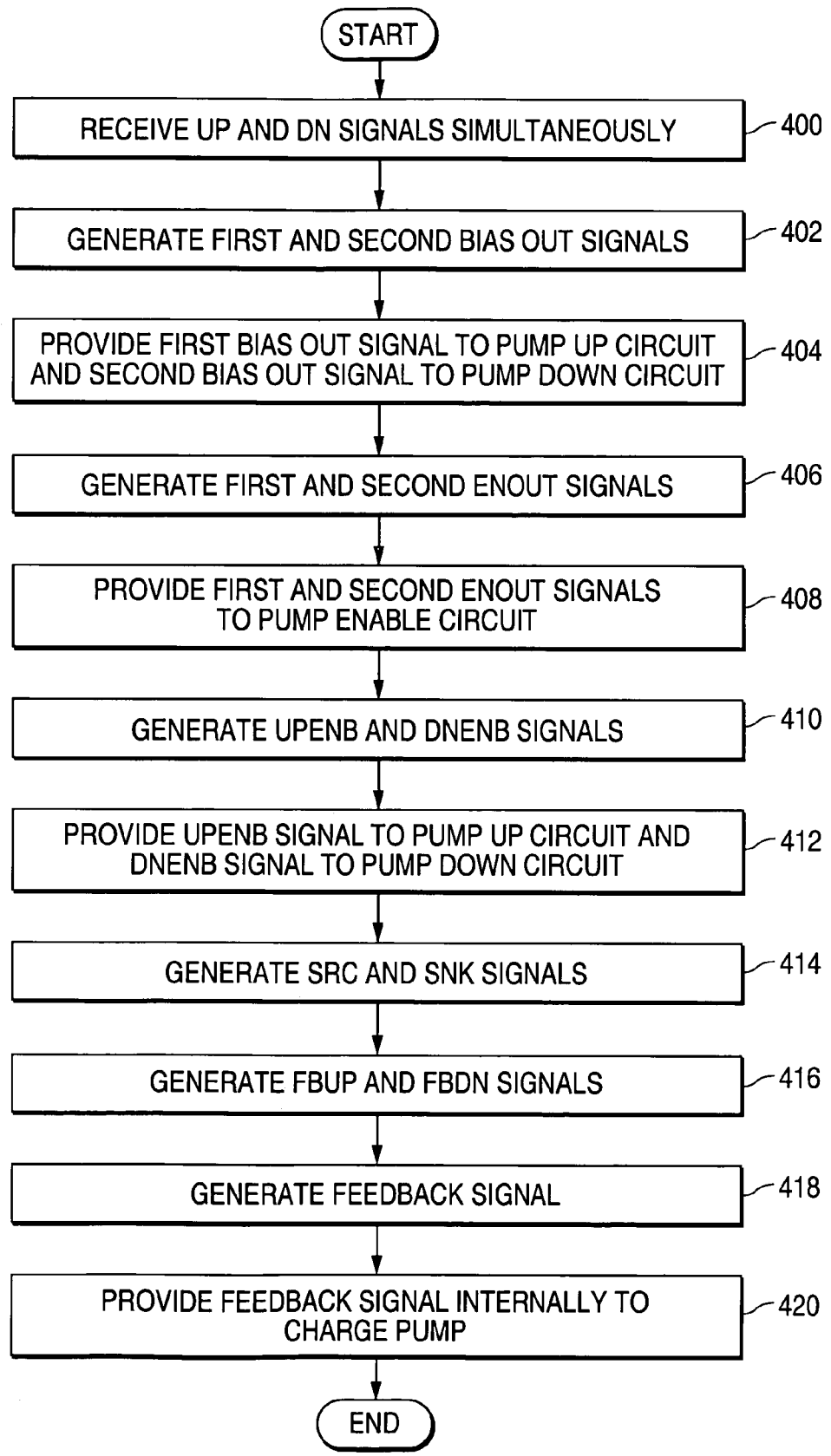
FIG. 7 is a flow diagram illustrating a method for internally resetting a charge pump in accordance with one embodiment of the present invention.

FIG. 7 is a flow diagram illustrating a method for internally resetting the charge pump 106 in accordance with one embodiment of the present invention. The method begins at step 400 where the charge pump 106 receives the up signal 126 and the down signal 128 simultaneously. As used herein, "received simultaneously" means that, at some point, both signals 126 and 128 are received together at the charge pump 106; however, it will be understood that one of the signals 126 or 128 may be received prior to the other signal 126 or 128.

At step 402, the first bias timing circuit 202 generates the BiasOut signal 214 based on the up signal 126, and the second bias timing circuit 204 generates the BiasOut signal 220 based on the down signal 128. At step 404, the first bias timing circuit 202 provides the BiasOut signal 214 to the pump up circuit 208, and the second bias timing circuit 204 provides the BiasOut signal 220 to the pump down circuit 210.

At step 406, the first bias timing circuit 202 generates the EnOut signal 218, and the second bias timing circuit 204 generates the EnOut signal 224. At step 408, the first bias timing circuit 202 provides the EnOut signal 218 to the pump enable circuit 206, and the second bias timing circuit 204 provides the EnOut signal 224 to the pump enable circuit 206.

At step 410, the pump enable circuit 206 generates the UpEnB signal 230 based on the EnOut signal 218 and generates the DnEnB signal 232 based on the EnOut signal 224. At step 412, the pump enable circuit 206 provides the UpEnB signal 230 to the pump up circuit 208 and the DnEnB signal 232 to the pump down circuit 210.

At step 414, the pump up circuit 208 generates the Src signal 234 based on the BiasOut signal 214 and the UpEnB signal 230, and the pump down circuit 210 generates the Snk signal 238 based on the BiasOut signal 220 and the DnEnB signal 232. At step 416, the pump up circuit 208 generates the FbUp signal 236, and the pump down circuit 210 generates the FbDn signal 240.

At step 418, the feedback circuit 212 generates the feedback signal 130 based on the FbUp and FbDn signals 236 and 240. At step 420, the feedback circuit 212 provides the feedback signal 130 internally to the charge pump 106 to reset the charge pump 106. This is accomplished by providing the feedback signal 130 to the pump enable circuit 206 and providing the inverted feedback signal 130 to the first and second bias timing circuits 202 and 204 as the DisIn signals 216 and 222, respectively. In addition, the feedback circuit 212 provides the feedback signal 130 to the phase detector 104 to reset the phase detector 104.

Although the present invention has been described with several embodiments, various changes and modifications may be suggested to one skilled in the art. It is intended that the present invention encompass such changes and modifications as fall within the scope of the appended claims.

What is claimed is:

1. A method for internally resetting a charge pump, comprising:
   receiving an up signal and a down signal simultaneously;
   generating a feedback signal based on the up and down signals;
   providing the feedback signal internally to the charge pump; and
   resetting the charge pump based on the feedback signal.

2. The method of claim 1, generating a feedback signal comprising generating a feedback up signal based on the up signal and a feedback down signal based on the down signal.

3. The method of claim 2, generating a feedback signal further comprising providing the feedback up signal and the feedback down signal to a two-input NAND gate and generating the feedback signal using the NAND gate.

4. The method of claim 3, providing the feedback signal internally to the charge pump comprising providing the feedback signal to a pump enable circuit.

5. The method of claim 4, providing the feedback signal internally to the charge pump further comprising inverting the feedback signal and providing the inverted feedback signal to a first bias timing circuit and to a second bias timing circuit.

6. The method of claim 1, further comprising:
   providing the feedback signal to a phase detector; and
   resetting the phase detector based on the feedback signal.

7. A system for internally resetting a charge pump, comprising:
   a phase detector operable to receive a reference clock signal and an internal clock signal, to compare the reference clock signal and the internal clock signal, and to generate an up signal when the internal clock signal is slower than the reference clock signal and a down signal when the internal clock signal is faster than the reference clock signal; and
   a charge pump coupled to the phase detector, the charge pump operable to receive the up and down signals, to generate a feedback signal based on the up and down signals, to provide the feedback signal internally to the charge pump, and to reset the charge pump based on the feedback signal.

8. The system of claim 7, the charge pump further operable to provide the feedback signal to the phase detector to reset the phase detector.

9. The system of claim 7, the charge pump further operable to generate a charge pump output signal based on the up and down signals, the system further comprising a loop filter coupled to the charge pump, the loop filter operable to receive the charge pump output signal and to generate a loop filter output signal based on the charge pump output signal.

10. The system of claim 9, the loop filter comprising a capacitor and resistor network that is operable to be charged up by the charge pump output signal based on the up signal and to have charge drained by the charge pump output signal based on the down signal.

11. The system of claim 9, further comprising an oscillator coupled to the loop filter, the oscillator operable to receive the loop filter output signal and to generate an output frequency signal based on the loop filter output signal.

12. The system of claim 11, the oscillator comprising a voltage-controlled oscillator.

13. The system of claim 11, further comprising a feedback divider coupled to the oscillator and to the phase detector, the feedback divider operable to receive the output frequency signal, to generate an internal clock signal based on the output frequency signal, and to provide the internal clock signal to the phase detector.

14. The system of claim 13, the feedback divider operable to generate the internal clock signal by dividing the output frequency signal by a predetermined value.

15. The system of claim 7, the charge pump comprising:
   a first bias timing circuit operable to receive an up signal from a phase detector and an up-disable-in signal from a feedback circuit and to generate an up-bias-out signal based on the up signal and the up-disable-in signal;
   a second bias timing circuit operable to receive a down signal from the phase detector and a down-disable-in signal from the feedback circuit and to generate a down-bias-out signal based on the down signal and the down-disable-in signal;
   a pump up circuit coupled to the first bias timing circuit, the pump up circuit operable to provide a current source based on the up signal;
   a pump down circuit coupled to the second bias timing circuit, the pump down circuit operable to provide a current sink based on the down signal;
   a pump enable circuit coupled to the first and second bias timing circuits and to the pump up circuit and the pump down circuit, the pump enable circuit operable to enable operation of the pump up circuit and the pump down circuit; and
   the feedback circuit coupled to the pump up and pump down circuits and to the first and second bias timing circuits, the feedback circuit operable to generate a feedback signal based on the up and down signals, to provide the feedback signal internally to the charge pump, and to reset the charge pump based on the feedback signal.

16. A charge pump, comprising:
   a first bias timing circuit operable to receive an up signal from a phase detector and an up-disable-in signal from a feedback circuit and to generate an up-bias-out signal based on the up signal and the up-disable-in signal;

a second bias timing circuit operable to receive a down signal from the phase detector and a down-disable-in signal from the feedback circuit and to generate a down-bias-out signal based on the down signal and the down-disable-in signal;

a pump up circuit coupled to the first bias timing circuit, the pump up circuit operable to provide a current source based on the up signal;

a pump down circuit coupled to the second bias timing circuit, the pump down circuit operable to provide a current sink based on the down signal;

a pump enable circuit coupled to the first and second bias timing circuits and to the pump up circuit and the pump down circuit, the pump enable circuit operable to enable operation of the pump up circuit and the pump down circuit; and the feedback circuit coupled to the pump up and pump down circuits and to the first and second bias timing circuits, the feedback circuit operable to generate a feedback signal based on the up and down signals, to provide the feedback signal internally to the charge pump, and to reset the charge pump based on the feedback signal.

17. The charge pump of claim 16, the feedback circuit comprising:
    a two-input NAND gate operable to generate the feedback signal;
    a first inverter coupled to the NAND gate and to the first bias timing circuit, the first inverter operable to invert the feedback signal and provide the inverted feedback signal to the first bias timing circuit; and
    a second inverter coupled to the NAND gate and to the second bias timing circuit, the second inverter operable to invert the feedback signal and provide the inverted feedback signal to the second bias timing circuit.

18. The charge pump of claim 16,
    the first bias timing circuit further operable to generate an up-enable-out signal based on the up signal;
    the second bias timing circuit further operable to generate a down-enable-out signal based on the down signal; and
    the pump enable circuit further operable to receive the up-enable-out from the first bias timing circuit, the down-enable out signal from the second bias timing circuit, and the feedback signal from the feedback circuit, to generate an up enable signal based on the up-enable-out signal and the feedback signal, and to generate a down enable signal based on the down-enable-out signal and the feedback signal.

19. The charge pump of claim 18,
    the pump up circuit further operable to receive the up-bias-out signal from the first bias timing circuit and the up enable signal from the pump enable circuit and to generate a source signal and a feedback up signal based on the up-bias-out and up enable signals; and
    the pump down circuit further operable to receive the down-bias-out signal from the second bias timing circuit and the down enable signal from the pump enable circuit and to generate a sink signal and a feedback down signal based on the down-bias-out and down enable signals.

20. The charge pump of claim 19, the feedback circuit further operable to receive the feedback up signal from the pump up circuit and the feedback down signal from the pump down circuit and to generate the feedback signal based on the feedback up and feedback down signals.

* * * * *

UNITED STATES PATENT AND TRADEMARK OFFICE
CERTIFICATE OF CORRECTION

| | |
|---|---|
| PATENT NO. | : 7,061,289 B1 |
| APPLICATION NO. | : 10/236034 |
| DATED | : June 13, 2006 |
| INVENTOR(S) | : David L. Broughton and Kim Y. Wong |

It is certified that error appears in the above-identified patent and that said Letters Patent is hereby corrected as shown below:

Column 8, line 1, delete "desired the" and replace with -- the desired --;

Column 8, line 21, delete "desired the" and replace with -- the desired --.

Signed and Sealed this

Thirteenth Day of March, 2007

JON W. DUDAS
*Director of the United States Patent and Trademark Office*